United States Patent [19]

Aoai et al.

[11] Patent Number: 4,786,577
[45] Date of Patent: Nov. 22, 1988

[54] PHOTO-SOLUBILIZABLE COMPOSITION ADMIXTURE WITH RADIATION SENSITIVE ACID PRODUCING COMPOUND AND SILYL ETHER GROUP CONTAINING COMPOUND WITH EITHER URETHANE, UREIDO, AMIDO, OR ESTER GROUP

[75] Inventors: Toshiaki Aoai; Akihiko Kamiya, both of Kanagawa, Japan

[73] Assignee: Fuji Photo Film Co., Ltd., Kanagawa, Japan

[21] Appl. No.: 807,937

[22] Filed: Dec. 12, 1985

[30] Foreign Application Priority Data

Dec. 14, 1984 [JP] Japan .................................. 59-264183

[51] Int. Cl.$^4$ .............................................. G03C 1/495
[52] U.S. Cl. ..................................... 430/192; 430/270; 430/280; 430/291; 430/302; 430/913; 430/919; 430/925
[58] Field of Search ............... 430/270, 280, 291, 192, 430/302, 913, 919, 925

[56] References Cited

U.S. PATENT DOCUMENTS

| | | | |
|---|---|---|---|
| 3,779,778 | 12/1973 | Smith et al. | 430/270 |
| 3,929,488 | 12/1975 | Smith | 430/191 |
| 4,163,672 | 8/1979 | Stahlhofer | 430/191 |
| 4,439,512 | 3/1984 | Ceintrey | 430/180 |
| 4,458,000 | 7/1984 | Stahlhofer | 430/270 |

FOREIGN PATENT DOCUMENTS 130599  1/1985  European Pat. Off. ............ 430/192

Primary Examiner—Charles L. Bowers, Jr.
Attorney, Agent, or Firm—Sughrue, Mion, Zinn, Macpeak & Seas

[57] ABSTRACT

A photo-solubilizable composition is disclosed, comprising (a) a compound capable of producing an acid upon being irradiated with actinic light rays, and (b) a compound containing at least one silyl ether group represented by formula (I)

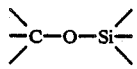

(I)

that is capable of being decomposed with an acid and at least one group selected from among a urethane group, a ureido group, an amido group, and an ester group, and, according to a preferred embodiment at least one hydrophilic group.

16 Claims, No Drawings

PHOTO-SOLUBILIZABLE COMPOSITION ADMIXTURE WITH RADIATION SENSITIVE ACID PRODUCING COMPOUND AND SILYL ETHER GROUP CONTAINING COMPOUND WITH EITHER URETHANE, UREIDO, AMIDO, OR ESTER GROUP

FIELD OF THE INVENTION

This invention relates to a photo-solubilizable composition useful for production of lithographic printing plates, for color proofing sheets in multi-color printing, for preparing drawings for an overhead projector, for preparing integrated circuits, and for photomasks. More particularly, it relates to a novel photo-solubilizable composition containing (a) a compound capable of producing an acid upon being irradiated with actinic light rays, and (b) a particular type of compound containing at least one silyl ether group capable of being decomposed with an acid.

BACKGROUND OF THE INVENTION

As light-sensitive substances which are solubilized by irradiation with actinic light rays, or which are of so-called "positive-working" type, there have conventionally been known o-quinonediazide compounds, which have actually been widely used for preparing lithographic printing plates, photoresists, etc. Examples of such o-quinonediazide compounds are described in many publications including U.S. Pat. Nos. 2,766,118, 2,767,092, 2,772,972, 2,859,112, 2,907,665, 3,046,110, 3,046,111, 3,046,115, 3,046,118, 3,046,119, 3,046,120, 3,046,121, 3,046,122, 3,046,123, 3,061,430, 3,102,809, 3,106,465, 3,635,709, 3,647,443, etc.

Such o-quinonediazide compounds are decomposed upon irradiation with actinic light rays to form five-membered carboxylic acids, and thus become alkali solution soluble are utilized. However, all of them have the defect that they possess only insufficient light sensitivity. This is attributed to the fact that, with o-quinonediazides, the quantum yield essentially cannot exceed 1.

Various attempts have so far been made to raise light sensitivity of a light-sensitive composition containing the o-quinonediazide compound. However, it has been extremely difficult to raise light sensitivity while keeping development latitude at the same level upon development. Examples of such attempts are described in Japanese Patent Publication No. 12242/73 (corresponding to U.S. Pat. No. 3,661,582 and DE No. 2,028,214), Japanese Patent Application (OPI) No. 40125/77 (corresponding to U.S. Pat. No. 4,009,033) (The term "OPI" as used herein refers to a "published unexamined Japanese patent application"), U.S. Pat. No. 4,307,173, etc.

Recently, several proposals have been made as to positive-working light-sensitive composition without using o-quinonediazide compounds. As one example thereof, there is illustrated polymer compounds having an o-nitro-carbinol ester group, described in Japanese Patent Publication No. 2696/81 (corresponding to U.S. Pat. No. 3,849,137 and DE No. 2,150,691). With the compounds, too, however, very high light sensitivity is not attained due to the same reason as with the o-quinonediazides. Apart from this, as a process for raising light sensitivity using a light-sensitive system which is activated by catalytic action, there has been applied a known principle of causing a second reaction with an acid produced by photolysis, to thereby solubilize exposed areas.

Examples of applying this principle include a combination of a compound capable of producing an acid upon photolysis and an acetal or O,N-acetal compound (Japanese Patent Application (OPI) No. 89003/73, U.S. Pat. No. 3,779,778 and DE No. 2,306,248), a combination with an orthoester or amidoacetal compound (Japanese Patent Application (OPI) No. 120714/76, U.S. Pat. No. 4,101,323 and DE No. 2,610,842), a combination with a polymer having acetal or ketal group in the main chain (Japanese Patent Application (OPI) No. 133429/78, U.S. Pat. No. 4,247,611 and DE No. 2,718,254), a combination with an enol ether compound (Japanese Patent Application (OPI) No. 122995/80, U.S. Pat. No. 4,248,957 and DE No. 2,829,511), a combination with an N-acyliminocarbonic acid compound (Japanese Patent Application (OPI) No. 126236/80, U.S. Pat. No. 4,250,247 and DE No. 2,829,512), and a combination with a polymer having orthoester group in the main chain (Japanese Patent Application (OPI) No. 17345/81, U.S. Pat. No. 4,311,782 and DE No. 2,928,636). Since these compounds principally provide a quantum yield of more than 1, there is a possibility of showing a high light sensitivity. However, with the acetal or O,N-acetal compounds and the polymer having acetal or ketal group in the main chain thereof, the rate of the second reaction to be caused with an acid produced by photolysis is so slow that they do not show an enough light sensitivity to be actually used. The ortho ester or amidoacetal compound, the enol ether compound, and the N-acyliminocarbonic acid compound have poor stability with time, and cannot be stored for a long time, although they do provide a high light sensitivity. Polymers having orthoester group in the main chain thereof have the defect that they possess only a narrow development latitude upon development, although they also provide a high light sensitivity.

SUMMARY OF THE INVENTION

An object of the present invention is to provide a novel photo-solubilizable composition which can solve the above-described problems, that is, to provide a novel photo-solubilizable composition which has high light sensitivity and a wide development latitude upon development.

Another object of the present invention is to provide a novel photo-solubilizable composition which has excellent stability with time, and which can be stored for a long time.

A further object of the present invention is to provide a novel photo-solubilizable composition which can be easily prepared and is therefore readily available.

These and other objects of the present invention will become apparent from the following description thereof.

As a result of intensive investigations to attain the above-described and other objects, the inventors have found that the objects can be attained by using a novel photo-solubilizable composition, and thus have achieved the present invention.

That is, the present invention is directed to photo-solubilizable composition (1) comprising (a) a compound capable of producing an acid upon being irradiated with actinic light rays, and (b) a compound containing at least one silyl ether group represented by formula (I)

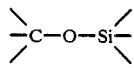  (I)

that is capable of being decomposed with an acid and at least one group selected from among a urethane group, a ureido group, an amido group, and an ester group.

A preferred photo-solubilizable composition (2) according to the present invention comprises (a) a compound cpable of producing an acid upon being irradiated with actinic light rays, and (b) a compound containing at least one silyl ether group represented by formula (I)

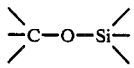  (I)

that is capable of being decomposed with an acid and at least one group selected from among a urethane group, a ureido group, an amido group, and an ester group, and at least one hydrophilic group.

DETAILED DESCRIPTION OF THE INVENTION

The photo-solubilizable composition (2) of the present invention containing a compound having a hydrophilic group has particularly excellent coating properties for a support having a hydrophilic surface.

The term "hydrophilic group" as used herein specifically includes preferably the following groups:

$-(-CH_2CH_2-O-)_{\overline{n}}$  $-(-CH_2)_{\overline{l}}O-)_{\overline{m}}(-CH_2CH_2-O-)_{\overline{n}}$ $-(-CHCH_2-O-)_{\overline{m}}(-CH_2CH_2-O-)_{\overline{n}}$  $-(-CH_2CHCH_2-O-)_{\overline{n}}$
$\phantom{-(-}R$  $\phantom{-(-CH_2CH_2-O-)_{\overline{m}}(-}OH$

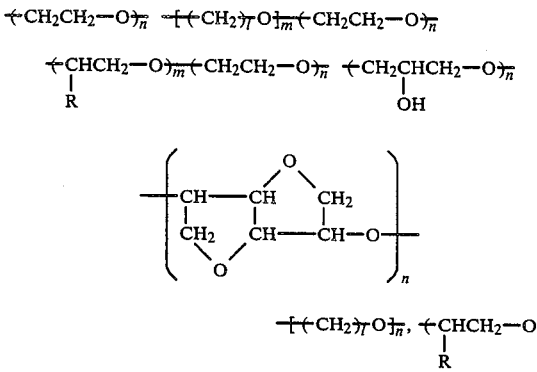

$-(-(-CH_2)_{\overline{l}}O-)_{\overline{n}}$, $-(-CHCH_2-O-)_{\overline{n}}$
$\phantom{-(-(-CH_2)_{\overline{l}}O-)_{\overline{n}},(-}R$ wherein l represents an integer of from 1 to 4, m and n each represents an integer of 2 or more, preferably from 2 to 100, more preferably from 2 to 20, R represents an alkyl group or a substituted or unsubstituted phenyl group. A particularly preferable hydrophilic group is $-(-CH_2CH_2-O-)_{\overline{n}}$.

Compounds (b) to be used in the present invention are preferably those which has at least one silyl ether group represented by formula (I) and capable of being decomposed with an acid and at least one group selected from among a urethane group, a ureido group, an amido group, an an ester group, or those which further have at least one hydrophilic group. Such compounds can be represented by the repeating units of formula (II)

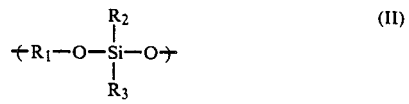  (II)

wherein $R_1$ represents a divalent aliphatic or aromatic hydrocarbon containing at least one of a urethane group, a ureido group, an amido group, and an ester group, and, if desired, at least one hydrophilic group, $R_2$ and $R_3$, which may be the same or different, each represents a hydrogen atom, an alkyl group, an alkenyl group, a substituted or unsubstituted aryl group, a substituted or unsubstituted aralkyl group, or $-OR_4$, preferably an alkyl group containing from 1 to 4 carbon atoms or $-OR_4$, $R_4$ represents a substituted or unsubstituted alkyl group, a substituted or unsubstituted aryl group or a substituted or unsubstituted aralkyl group, preferably an alkyl group containing from 1 to 8 carbon atoms, or an aryl group containing from 6 to 15 carbon atoms.

Further, compounds (b) to be used in the present invention may contain two or more kinds of the repeating units represented by formula (II), or may be compounds which have one or more repeating units represented by formula (II) and one or more repeating units represented by formula (III)

  (III)

wherein $R_5$ represents a divalent aliphatic or aromatic hydrocarbon not containing a urethane group, a ureido group, an amido group, and an ester group but having, if necessary, at least one hydrophilic group, and $R_2$ and $R_3$ are same as above (II).

Specific examples of the compound (b) include those listed below.

Compound Nos. 1 to 37 show compounds having no hydrophilic groups, and Nos. 38 to 45 show compounds having a hydrophilic group or groups.

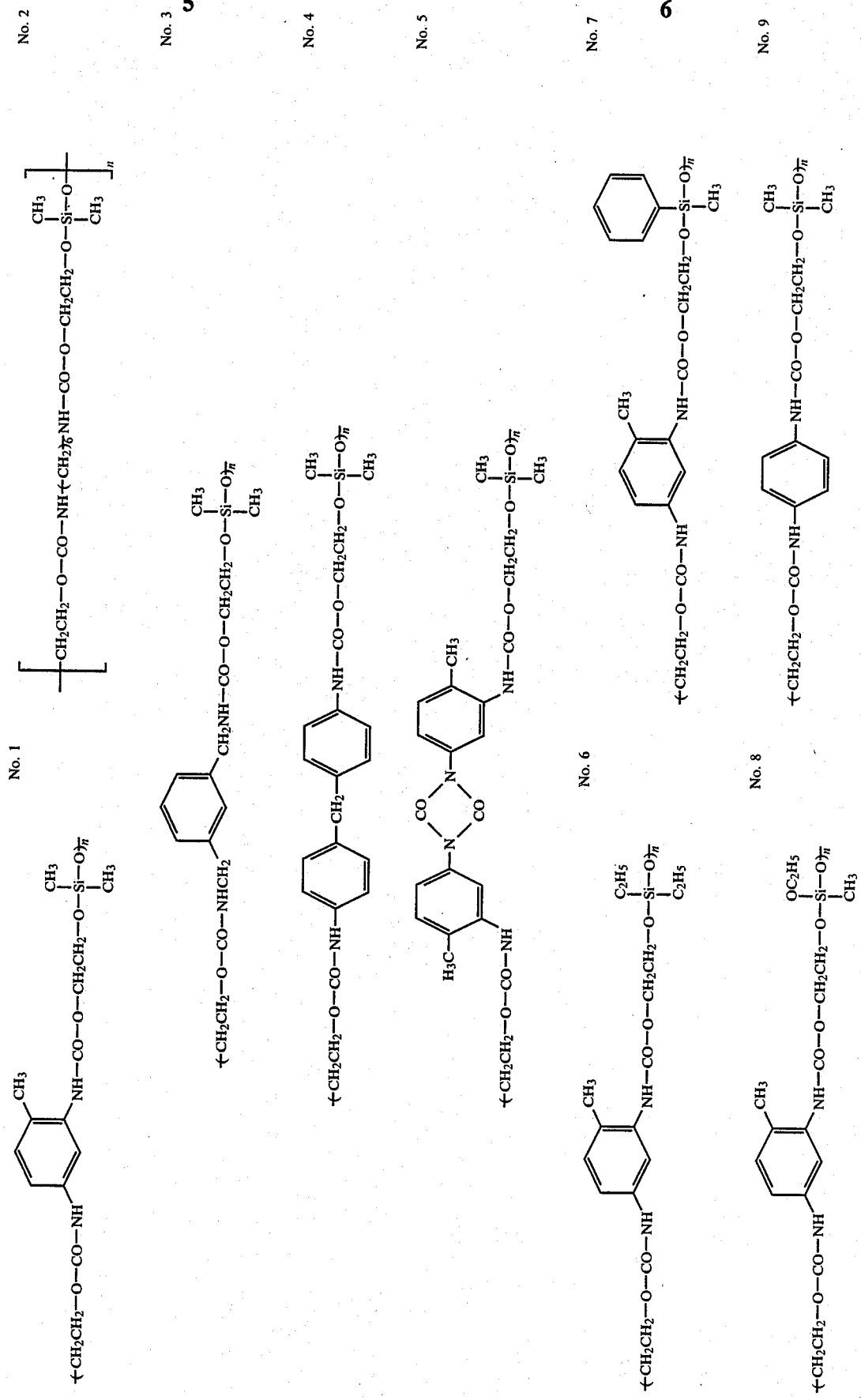

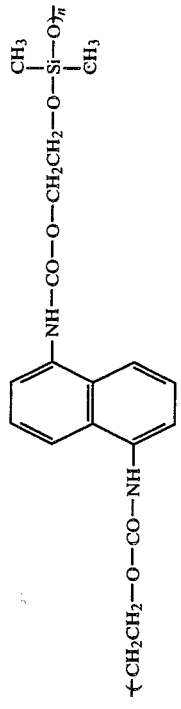
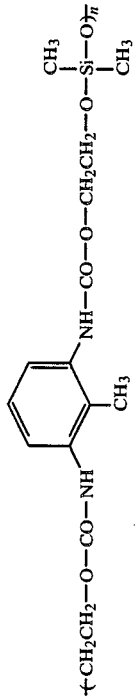
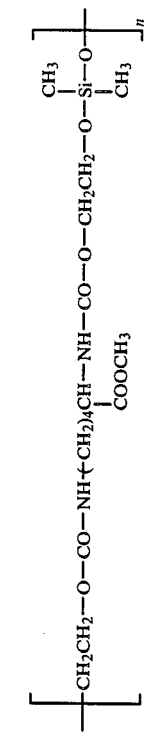
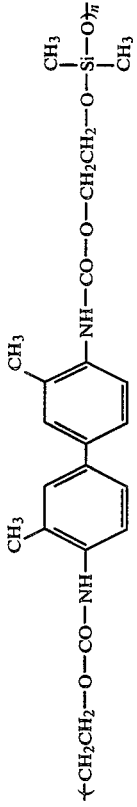
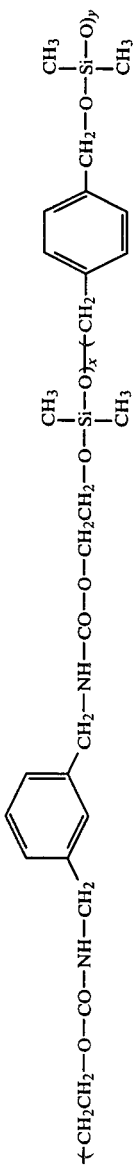

-continued
No. 19 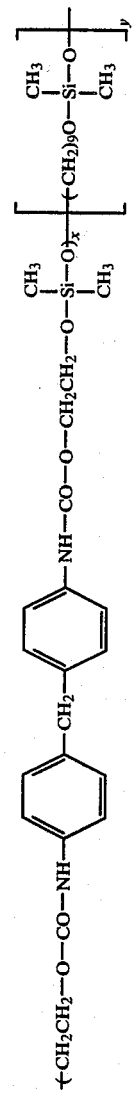
No. 20 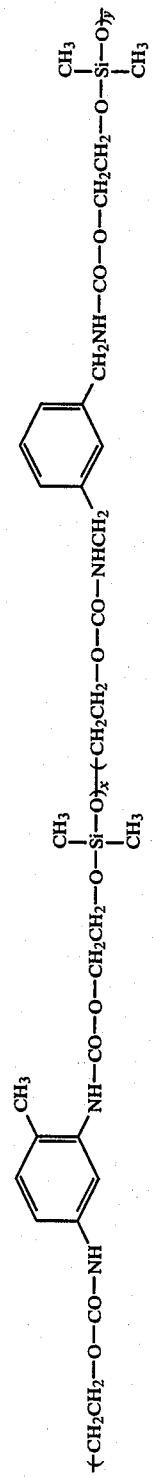
No. 21 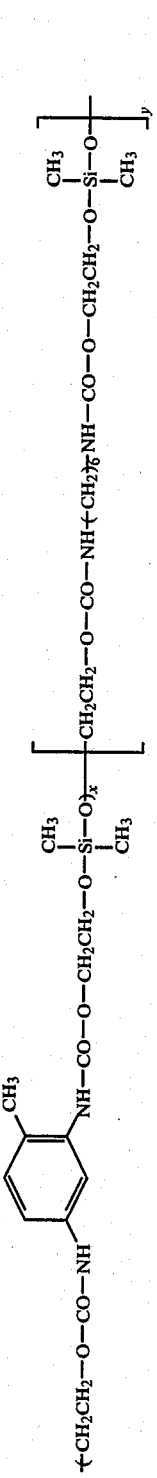
No. 22 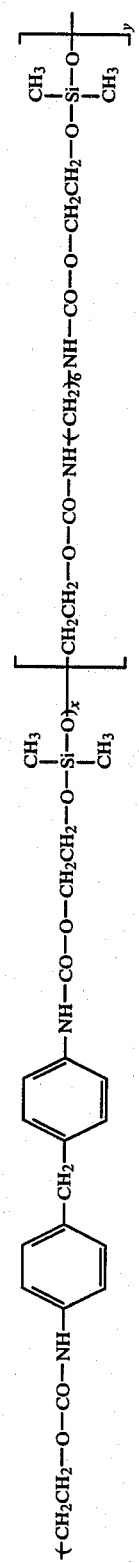
No. 24 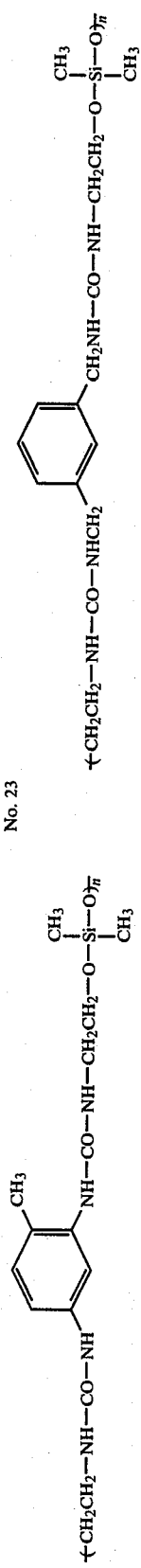
No. 26 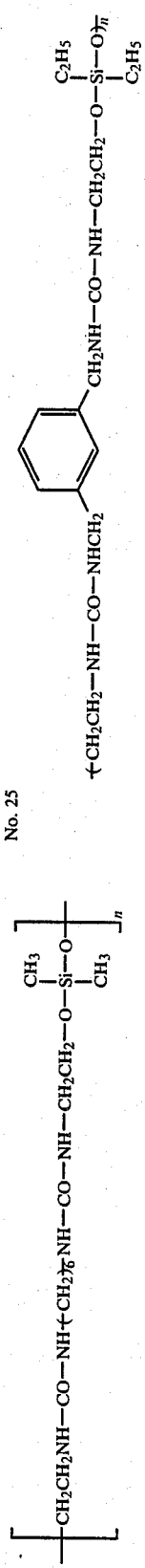
No. 23 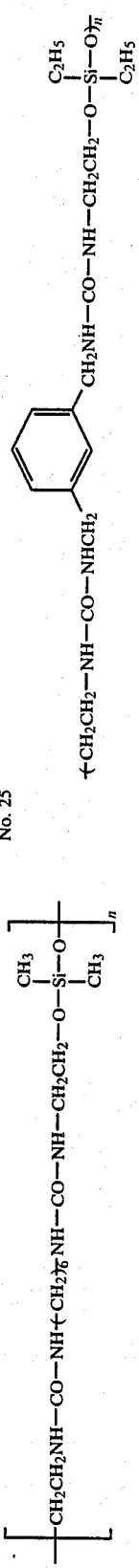
No. 25 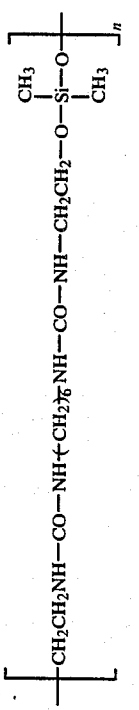

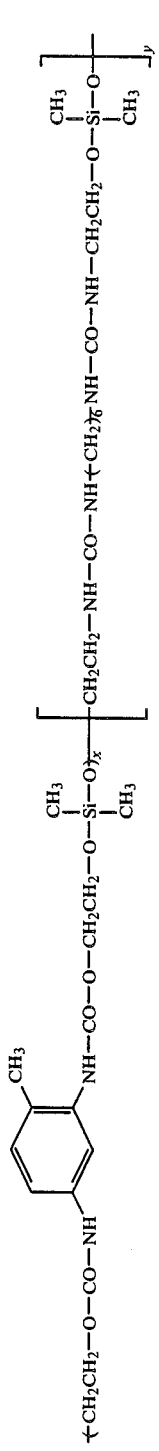
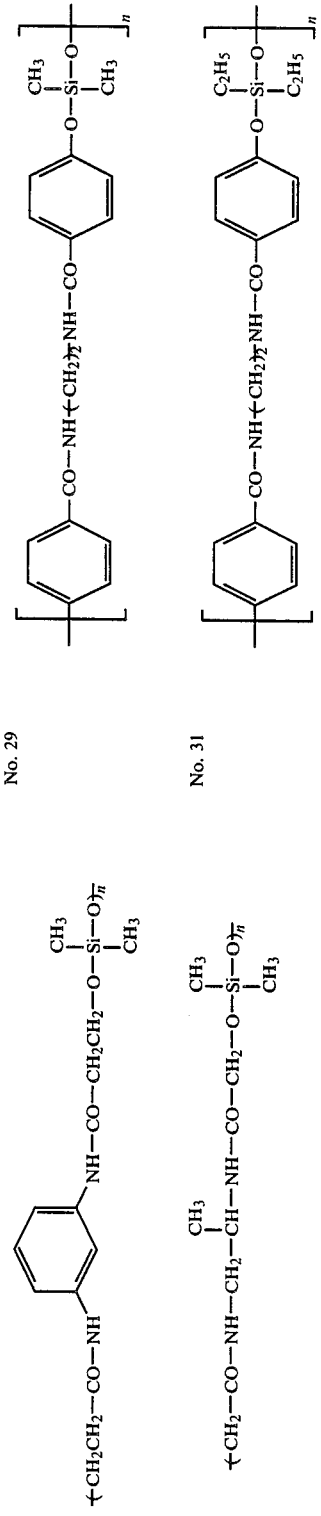

No. 36
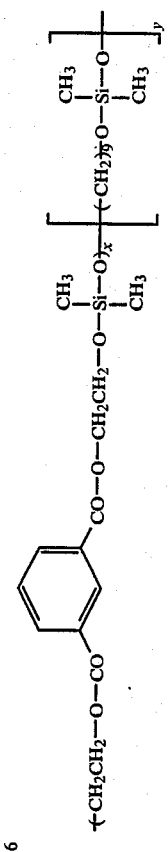
No. 37
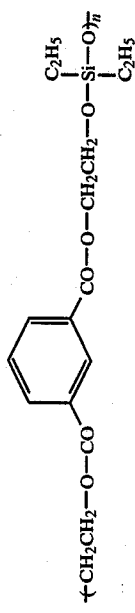
No. 38
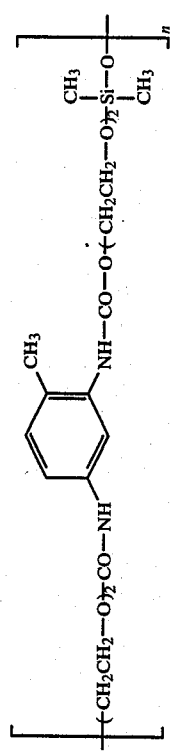
No. 39
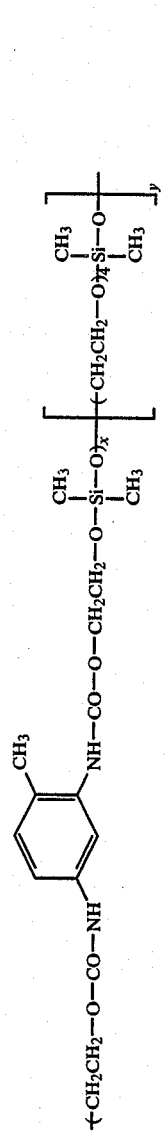
No. 40
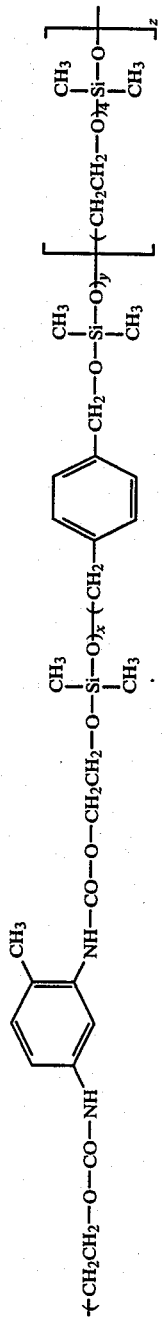
No. 41
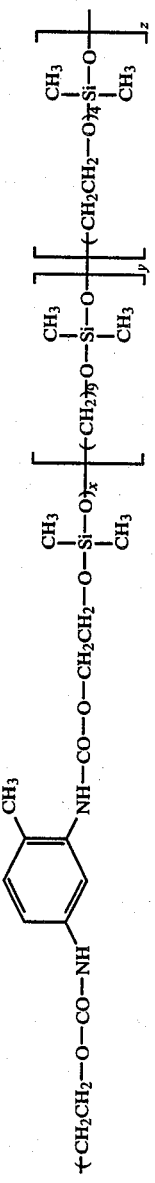
No. 42
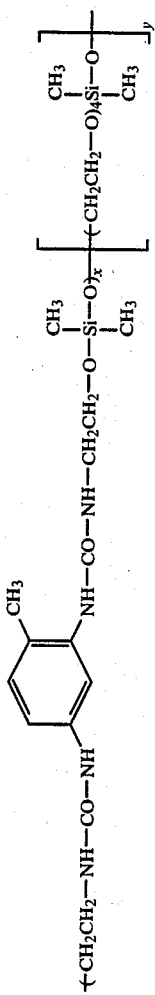

-continued
No. 43 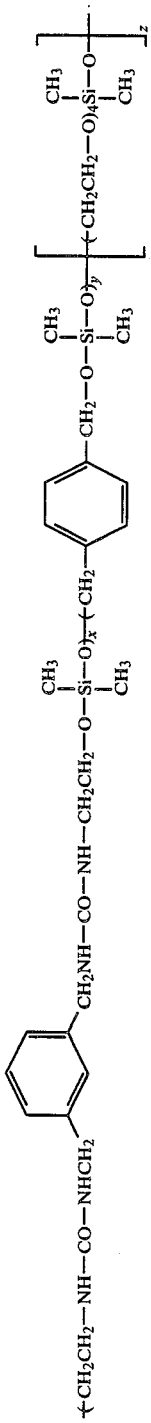
No. 44 
No. 45 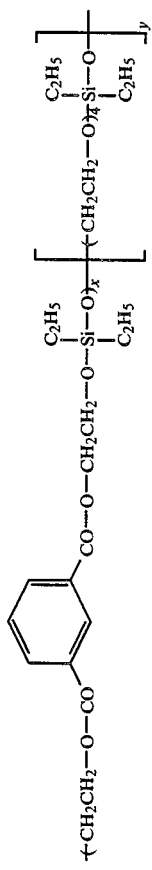

Additionally, n in the specific examples shown represents an integer of 1 or more; x, y, and z each represents a molar ratio; and, in compound Nos. 40, 41, and 43, x=5 to 100 mol %, y=0 to 95 mol %, and z=0 to 95 mol%. In compound Nos. 16-22, 27-28, 33, 37, 39, 42, and 44-45, x=5-100 mol % and y=0 to 95 mol %.

As compounds which are capable of producing an acid upon irradiation with actinic light rays and are to be used in combination with the above described compounds having at least one silyl ether group capable of being decomposed with an acid, many known compounds and mixtures such as salts of diazonium, phosphonium, sulfonium, and iodonium with $BF_4^-$, $PF_6^-$, $SbF_6^-$, $SiF_6^-$, $ClO_4^-$, etc., organic halogen compounds, o-quinonediazide-sulfonyl chloride, and a combination of an organometal/an organic halogen compound are suitable. Of course, compounds described in U.S. Pat. No. 3,779,778 and West German Pat. No. 2,610,842, capable of producing an acid through photolysis, can be used in the composition of the present invention. Further, comounds designed for providing a visible contrast between unexposed portion and exposed portion when exposed in combination with proper dyes, for example, compounds described in Japanese Patent Application (OPI) Nos. 77742/80 and 163234/82 (corresponding to U.S. Pat. Nos. 4,279,982 and 4,399,210, respectively) can also be used in the composition of the present invention.

Of the above-described compounds capable of producing an acid upon photolysis, o-quinonediazide-sulfonyl chloride, halomethyl-substituted s-triazine derivatives, and oxadiazole derivatives are preferable. Because, with o-quinonediazide-sulfonyl chloride, three acid groups (i.e., hydrochloric acid, sulfonic acid, and carboxylic acid) are formed upon exposure, and hence the compound can decompose the aforesaid silyl ether group in a comparatively large ratio.

The weight ratio of the compound capable of producing an acid upon irradiation with actinic light rays to the compound having at least one silyl ether group capable of being decomposed with an acid is 0.001/1 to 2/1 by weight, and preferably from 0.02/1 to 0.8/1.

The photo-solubilizable composition of the present invention may comprise a combination of only the above-described compound capable of producing an acid upon irradiation with actinic light rays and the compound having at least one silyl ether group capable of being decomposed with an acid; however, preferably, the combination is mixed to include an alkali-solution soluble resin. Preferable alkali-solution soluble resins include novolak type phenol resins, specifically a phenol-formaldehyde resin, an o-cresol-formaldehyde resin, an m-cresol-formaldehyde resin, etc. Further, as is described in Japanese Patent Application (OPI) No. 125806/75, combined use of the above-described phenol resin with an condensate between phenol or cresol substituted by an alkyl group containing from 3 to 8 carbon atoms and formaldehyde, such as t-butylphenol-formaldehyde resin is more preferable. The alkali-solution soluble resin is preferably incorporated in an amount of from about 40 to about 90 wt %, and more preferably, from 60 to 80 wt %, based on the total weight of the photo-solubilizable composition.

In the photo-solubilizable composition of the present invention there may be further incorporated, if desired, dyes, pigments, plasticizers, and compounds capable of enhancing acid-producing ratio of the aforesaid acid-producing compounds (called sensitizers).

Suitable dyes include oil-soluble dyes and basic dyes. Specifically, there are illustrated Oil Yellow #101, Oil Yellow #130, Oil Pink #312, Oil Green BG, Oil Blue BOS, Oil Blue #603, Oil Black BY, Oil Black BS, Oil Black T-505 (these being products of Orient Kagaku Kogyo K.K.), Crystal Violet (CI-42555), Methyl Violet (CI 42535), Rhodamine B (CI 45170B), Malachite Green (CI 42000), Methylene Blue (CI 52015), etc.

The photo-solubilizable composition of the present invention is dissolved in a solvent which can dissolve the ingredients described above, and the resulting solution is coated on a support. Examples of solvent that can be used include ethylene dichloride, cyclohexanone, methyl ethyl ketone, ethylene glycol monomethyl ether, ethyleneglycol monoethyl ether, 2-methoxyethyl acetate, toluene, ethyl acetae, etc. These solvents are used independently or as a combination. The concentration of the composition of the present invention (solids) in the above-described ingredients (total solids including additives) generally ranges from 2 to 50 wt %. Preferable concentration of the composition of the present invention (solids) in the total solids accounts for from 0.1 to 25 wt %. The amount to be coated varies depending upon use, but, with presensitized lithographic plates, coating including solvents is generally effected in an amount of from 0.5 to 3.0 g/m$^2$ as solids. As the coated amount decreases, light sensitivity increases, while the physical properties of the light-sensitive membrane are deteriorated.

In the case of preparing a lithographic printing plate using the photo-solubilizable composition of the present invention, aluminum plates rendered hydrophilic, such as a silicate-treated aluminum plate, an anodized aluminum plate, a grained aluminum plate, and a silicate-electrodeposited aluminum plate are used as supports. In addition, a zinc plate, a stainless steel plate, a chromium-treated steel plate, and a plastic film or paper rendered hydrophilic may be used as supports.

As supports for the production of proofing sheets for printing, films for overhead projectors, and films for secondary original, there are illustrated transparent films such as polyethylene terephthalate film, triacetate film, etc., and these plastic films whose surface has been matted chemically or physically. As supports suited for the production of photomasks, there are illustrated a polyethylene terephthalate film having deposited thereon aluminum, aluminum alloy or chromium and a polyethylene terephthalate film having a colored layer. As a photoresist, the photo-solubilizable composition of the present invention is coated on various supports other than the above-described, such as a copper plate, a copper-plated plate, or a glass plate to use.

Sources of actinic light rays include, for example, a mercury lamp, a metal halide lamp, a xenon lamp, a chemical lamp, a carbon arc lamp, etc. In addition, scanning exposure using a high density energy beam (laser beam or electron beam) may also be employed. Such laser beams include helium.neon laser, argon laser, krypton ion laser, halium.cadmium laser, etc.

As a developing solution for the photo-solubilizable composition of the present invention, aqueous solutions of inorganic alkali agents such as sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium metasilicate, sodium bicarbonate, aqueous ammonia, etc. are suitable. These are added in such amounts that concentration thereof in the solution becomes from 0.1 to 10 wt %, and preferably from 0.5 to 5 wt %.

If desired, a surfactant or an organic solvent such as alcohol may be added to the alkali aqueous solution.

The present invention is now illustrated in more detail by reference to the following examples, which, however, are not to be construed as limiting the present invention in any way.

SYNTHESIS EXAMPLE 1

(Synthesis of starting material for synthesizing Compound No. 1)

A catalytic amount of pyridine was added to 1 liter of ethylene glycol, and 139 g of 2,4-tolylenediisocyanate was dropwise added thereto through a dropping funnel with stirring in about 40 minutes. After completion of the addition, stirring was continued for further 2 hours at 70° C. Then, the reaction solution was cooled in an ice-methanol bath to precipitate white solids, which were collected by filtration and recrystallized from about 2 liters of water to obtain 214 g of white crystal (yield: 90%). NMR analysis and elemental analysis of the white crystal revealed that the crystal was bis-(2-hydroxyethyl)-2,4-tolylene dicarbamate below.

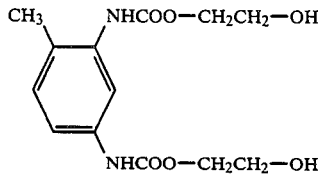

SYNTHESIS EXAMPLE 2

(Synthesis of starting material for synthesizing Compound No. 23)

A catalytic amount of triethylamine was added to 1 liter of monoethanolamine, and 139 g of 2,4-tolylenediisocyanate was dropwise added thereto through a dropping funnel in about one hour. After completion of the addition, stirring was continued for further one hour at 50° C. The white solids produced were collected by filtration, then recrystallized from about 3 liters of water to obtain 156 g (yield: 66%) of white crystal. NMR analysis and elemental analysis of the white crystal revealed that the white crystal was 2,4-tolylene-bis-(2-hydroxyethylcarbamide) below.

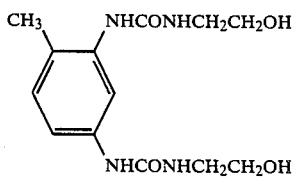

SYNTHESIS EXAMPLE 3

(Synthesis of Compound No. 1)

29.8 g (0.100 mole) of bis-(2-hydroxyethyl)-2,4-tolylenedicarbamate obtained in Synthesis Example 1 and 17.4 g (0.220 mole) of pyridine were stirred in 180 ml of ethyl acetate at room temperature, and a solution of 12.9 g (0.100 mole) of dichlorodimethylsilane in 20 ml of toluene was added thereto through a dropping funnel in about 30 minutes. After completion of the addition, stirring was continued for 5 hours at 50° C.

Pyridine hydrochloride produced was removed by filtration, and the reaction solution was washed successively with 200 ml of a 5% NaHCO₃ aqueous solution and 200 ml of a sodium chloride-saturated aqueous solution, then dried with Na₂SO₄. Then, the reaction solution was concentrated to dryness to obtain about 31 g of a colorless resin. This resin was identified as Compound No. 1 by NMR analysis. GPC (Gel Permeation Chromatography) of the resin using polystyrene as standard showed that the resin had an average molecular weight of about 4,500.

SYNTHESIS EXAMPLE 4

(Synthesis of Compound No. 17)

A mixture of 18.7 g (0.0600 mole) of bis(2-hydroxyethyl)m-xylylenedicarbamate below (obtained in the same manner as in Synthesis Example 1)

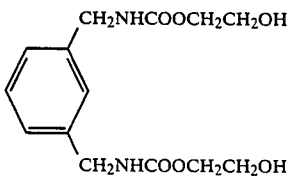

purified by recrystallization from water after removing ethylene glycol, 5.5 g (0.0400 mole) of p-xylylene glycol, and 17.4 g (0.220 mole) of pyridine in 180 ml of ethyl acetate was reacted and after-treated in the same manner as is described in Synthesis Example 3 to obtain 24 g of a colorless, viscous liquid. This was identified as Compound No. 17 by NMR analysis, and its average molecular weight was measured to be about 2,800 by GPC using polystyrene as a standard.

SYNTHESIS EXAMPLE 5

(Synthesis of Compound No. 42)

A mixture of 8.9 g (0.0300 mole) of 2,4-tolylene-bis(2-hydroxyethylcarbamide) (obtained in the same manner as in Synthesis Example 2), 13.6 g (0.0700 mole) of tetraethylene glycol, and 17.4 g (0.220 mole) of pyridine in 180 ml of ethyl acetate was reacted and after-treated in the same manner as in Synthesis Example 3 to obtain 22 g of a colorless, viscous liquid. This was identified as Compound No. 42 by NMR analysis, and its average molecular weight was measured to be about 1,500 by GPC using polystyrene as a standard.

SYNTHESIS EXAMPLE 6

(Synthesis of Compound No. 33)

A mixture of 10.1 g (0.0400 mole) N,N-m-phenylene-bis(3-hydroxypropionamide) below,

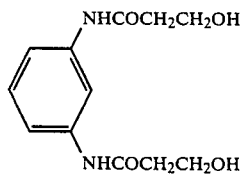

8.3 g (0.0600 mole) of p-xylene glycol, and 17.4 g (0.220 mole) of pyridine in 180 ml of ethyl acetate was reacted and after-treated in the same manner as in Synthesis Example 3 to obtain 20 g of a colorless, viscous liquid. This was identified as Compound No. 33 by NMR analysis, and its molecular weight was measured to be about 2,300 according to GPC using polystyrene as a standard.

SYNTHESIS EXAMPLE 7

(Synthesis of Compound No. 36)

To a stirred solution of 25.4 g (0.100 mole) of bis-(2-hydroxyethyl)isophthalate below,

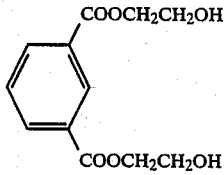

and 17.4 g (0.220 mole) of pyridine in 100 ml of toluene was dropwise added a solution of 15.7 g (0.100 mole) of dichlorodiethylsilane in 20 ml of toluene at room temperature in about 30 minutes. After completion of the addition, stirring was further continued for 8 hours at 50° C. Produced pyridine hydrochloride was removed by filtration, and the filtrate was after-treated in the same manner as in Synthesis Example 3 to obtain 27 g of a colorless, viscous liquid. This liquid was identified as Compound No. 36 by NMR analysis, and its average molecular weight was measured to be about 3,000 according to GPC using polystyrene as a standard.

EXAMPLE 1

A 0.24-mm thick 2S aluminum plate was dipped in a 10% aqueous solution of sodium tertiary phosphate kept at 80° C. for 3 minutes to degrease and, after graining with a nylon brush, the plate was etched for about 10 seconds with sodium aluminate and subjected to desmutting treatment in a 3% aqueous solution of sodium hydrogensulfate. This aluminum plate was anodized for 2 minutes in a 20% sulfuric acid at a current density of 2 A/dm$^2$ to prepare the aluminum plate.

Then six kinds of light-sensitive solutions (A)-1 to (A)-6 were prepared by changing the compound of the present invention used in the following light-sensitive solution (A), and respectively coated on anodized plates, then dried at 100° C. for 2 minutes to prepare presensitized lithographic plates (A)-1 to (A)-6. All of the solutions were coated in a dry weight of 1.5 g/m$^2$.

The compounds of the present invention used in light-sensitive solutions (A)-1 to (A)-6 are shown in Table 1.

Light-sensitive solution (A):

| | |
|---|---|
| Compound of the present invention | 0.40 g |
| Cresol-formaldehyde novolak resin | 1.1 g |
| 2-(p-Methoxyphenyl)-4,6-trichloro-methyl-s-triazine | 0.05 g |
| Oil Blue #603 (made by Orient Kagaku Kogyo K.K.) | 0.01 g |
| Ethylene dichloride | 10 g |
| Methyl cellosolve | 10 g |

Then, as a comparative sample, light-sensitive solution (B) below was coated in the same manner as with light-sensitive solution (A) to prepare presensitized lithographic plate (B).

Light-sensitive solution (B):

| | |
|---|---|
| Condensate between cresol-formaldehyde novolak resin and 1,2-naphthoquinone-2-diazide-5-sulfonyl chloride | 0.45 g |
| Cresol-formaldehyde novolak resin | 1.1 g |
| 1,2-Naphthoquinone-2-diazide-4-sulfonyl chloride | 0.02 g |
| Oil Blue #603 (made by Orient Kagaku Kogyo K.K.) | 0.01 g |
| Ethylene dichloride | 10 g |
| Methyl cellosolve | 10 g |

This solution was coated in a dry weight of 1.5 g/m$^2$.

A gray scale of 0.15 in density difference was closely superposed on the light-sensitive layer of each of the presensitized lithographic plates (A)-1 to (A)-6 and (B), and exposure was conducted using a 30-A (ampere) carbon arc lamp spaced at a distance of 70 cm.

In order to show the excellent light sensitivity of the samples of the present invention, the exposed presensitized lithographic plates were dipped for 60 seconds in a 25° C. aqueous solution prepared by diluting eight times DP-4 (trademark; made by Fuji Photo Film Co., Ltd.) to develop for determining exposure time which was enough to clear the 5th step of the gray scale of 0.15 in density difference. Thus, results tabulated in Table 1 were obtained.

TABLE 1

| Presensitized Lithographic Plate | Compound Used | Exposure Time (sec) |
|---|---|---|
| (A)-1 | Compound No. 38 of the present invention | 13 |
| (A)-2 | Compound No. 3 of the present invention | 11 |
| (A)-3 | Compound No. 16 of the Present invention | 20 |
| (A)-4 | Compound No. 42 of the present invention | 43 |
| (A)-5 | Compound No. 44 of the present invention | 35 |
| (A)-6 | Compound No. 34 of the present invention | 8 |
| (B) | Comparative sample | 50 |

Additionally, Compound Nos. 16, 42, and 44 of the present invention shown in Table 1 had an x/y ratio of 40/60 (molar ratio). The compounds of the present invention shown in Table 1 had an average molecular weight of from about 1,500 to about 3,000 measured according to GPC using polystyrene as a standard.

As is seen from Table 1, all presensitized lithographic plates (A)-1 to (A)-6 using the compounds of the present invention required less exposure time and had higher sensitivity than (B).

EXAMPLE 2

Presensitized lithographic plates (A)-1, (A)-2, (A)-4, (A)-5, and (A)-7 to (A)-8 were prepared in the same manner as in Example 1 using light-sensitive solutions (A)-1, (A)-2, (A)-4, and (A)-5 used in Example 1 and compounds in accordance with the present invention. All coating solutions were coated in a dry amount of 1.5 g/m$^2$. The compounds of the present invention used in light-sensitive solutions (A)-7 to (A)-8 are shown in Table 2.

In order to examine development latitude, a gray scale of 0.15 in density difference was closely superposed on each of the light-sensitive layers of presensi-

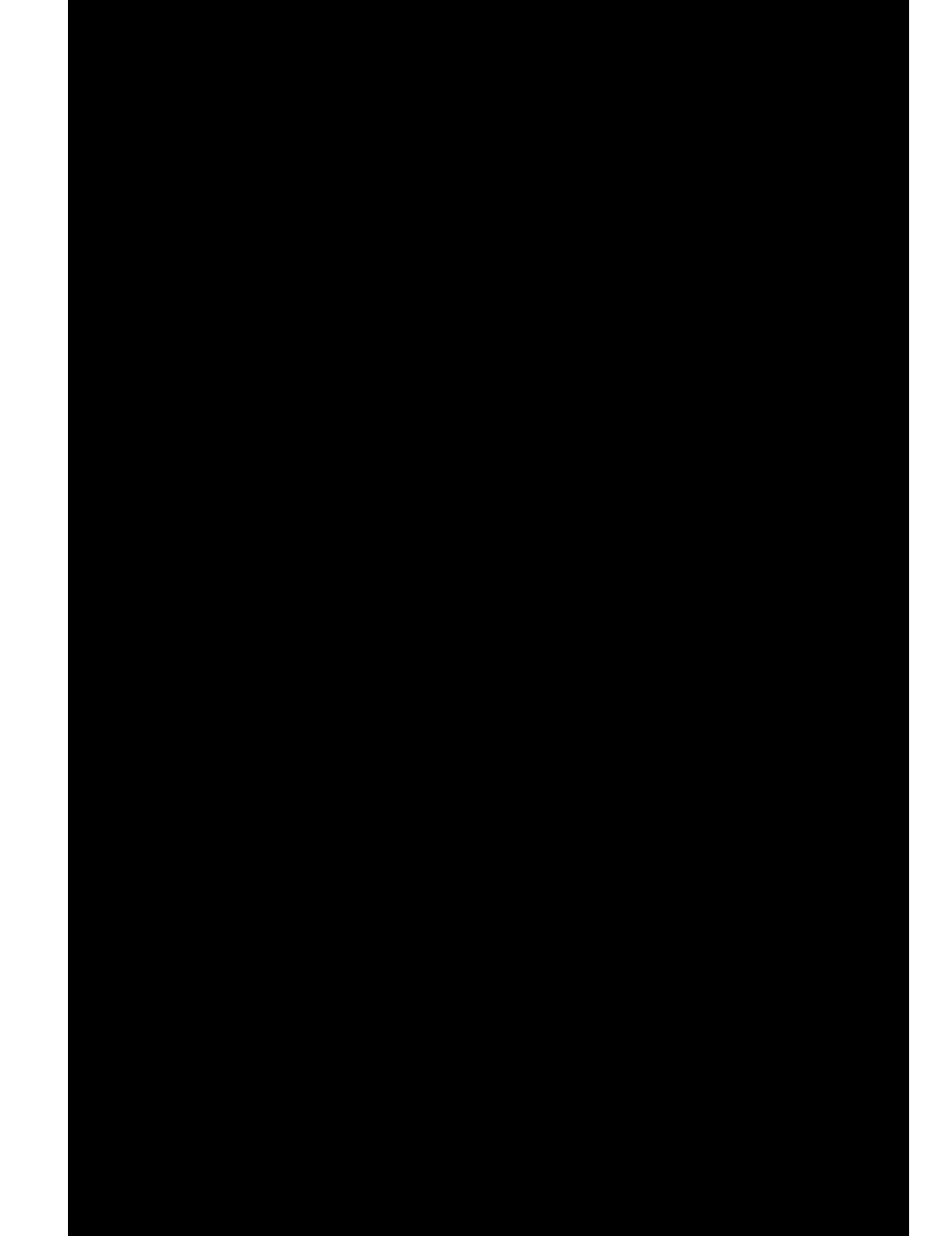

4. A photo-solubilizable composition as in claim 1, wherein the composition additionally comprises an alkali-solution soluble resin.

5. A photo-solubilizable composition as in claim 4, wherein the alkali-solution soluble resin is incorporated in an amount of from about 40 to about 90 wt%, based on the total weight of the photo-solubilizable composition.

6. A photo-solubilizable composition as in claim 1, wherein $R_1$ represents a divalent aliphatic or aromatic hydrocarbon containing a urethane group.

7. A photo-solubilizable composition comprising in admixture (a) a compound capable of producing an acid upon being irradiated with actinic light rays, and (b) a compound represented by the repeating units of formula (II)

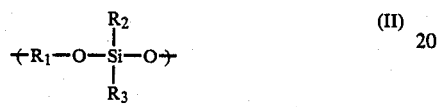

wherein $R_1$ represents a divalent aliphatic or aromatic hydrocarbon containing at least one of a urethane group, a ureido group, an amido group, and an ester group, and $R_2$ and $R_3$, which may be the same or different, each represents a hydrogen atom, an alkyl group, an alkenyl group, a substituted or unsubstituted aryl group, a substituted or unsubstituted aralkyl group, or —$OR_4$, wherein $R_4$ represents a substituted or unsubstituted alkyl group, a substituted or unsubstituted aryl group or a substituted or unsubstituted aralkyl group and wherein $R_1$ additionally comprises at least one hydrophilic group, wherein the weight ratio of the compound (a) to the compound (b) is from 0.001/1 to 2/1, and wherein said compound (a) and said compound (b) are present in an amount effective to provide excellent storage stability with time.

8. A photo-solubilizable composition as in claim 7, wherein the weight ratio of the compound (a) to the compound (b) is from 0.02/1 to 0.8/1.

9. A photo-solubilizable composition as in claim 7, wherein the composition additionally comprises an alkali-solution soluble resin.

10. A photo-solubilizable composition as in claim 9, wherein the alkali-solution soluble resin is incorporated in an amount of from about 40 to about 90 wt%, based on the total weight of the photo-solubilizable composition.

11. A photo-solubilizable composition as in claim 7, wherein the hydrophilic group is the following groups:

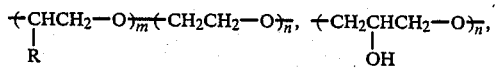

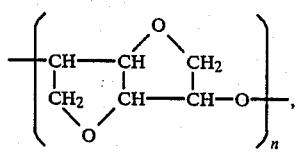

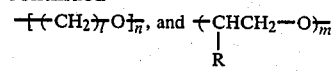

wherein l represents an integer from 1 to 4; m and n each represents an integer of 2 or more; and R represents an alkyl group or a substituted or unsubstituted phenyl group.

12. A photo-solubilizable composition as in claim 7, wherein the compound (b) is compounds which have one or more repeating units represented by formula (II) and one or more repeating units represented by formula (III)

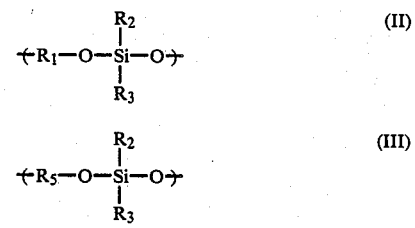

wherein $R_1$ represents a divalent aliphatic or aromatic hydrocarbon containing at least one of a urethane group, a ureido group, an amido group, and an ester group; $R_2$ and $R_3$ which may be the same or different, each represents a hydrogen atom, an alkyl group, an alkenyl group, a substituted or unsubstituted aryl group, a substituted or unsubstituted aralkyl group, or —$OR_4$, wherein $R_4$ represents a substituted or unsubstituted alkyl group, a substituted or unsubstituted aryl group or a substituted or unsubstituted aralkyl group; and $R_5$ represents a divalent aliphatic or aromatic hydrocarbon not containing a urethane group, a ureido group, an amido group, and an ester group but having at least one hydrophilic group.

13. A photo-solubilizable composition as in claim 12, wherein the hydrophilic group in said formula (III) is the following groups:

$+CH_2CH_2-O\}_n$, $+(CH_2)_lO\}_m(CH_2CH_2-O)_n$, $+CHCH_2-O\}_m(CH_2CH_2-O)_n$, $+CH_2CHCH_2-O\}_n$,
  |                                      |
  R                                      OH

[cyclic structure]

$+(CH_2)_lO\}_n$, and $+CHCH_2-O\}_n$
                         |
                         R wherein l represents an integer of from 1 to 4; m and n each represents an integer of 2 or more; and R represents an alkyl group or a substituted or unsubstituted phenyl group.

14. A photo-solubilizable composition as in claim 7, wherein the hydrophilic group in said formula (III) is the following groups:

$+CH_2CH_2-O\}_n$, $+(CH_2)_lO\}_m(CH_2CH_2-O)_n$,

-continued

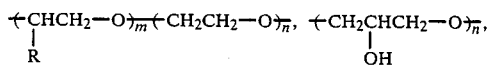

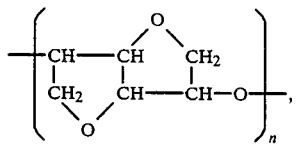

-continued

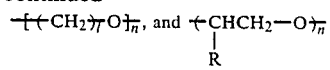

wherein l represents an integer of from 1 to 4; m and n each represents an integer of 2 or more; and R represents an alkyl group or a substituted or unsubstituted phenyl group.

15. A photo-solubilizable composition as in claim 7, wherein the compound (a) is selected from o-quinonediazide-sulfonyl chloride, halomethyl-substituted s-triazine derivatives, and oxadiazole derivatives.

16. A photo-solubilizable composition as in claim 7, wherein $R_1$ represents a divalent aliphatic or aromatic hydrocarbon containing a urethane group.

* * * * *